(12) United States Patent
Greenspan

(10) Patent No.: US 6,476,464 B1
(45) Date of Patent: Nov. 5, 2002

(54) LOW RESISTANCE HERMETIC LEAD STRUCTURE

(75) Inventor: Jay Greenspan, South Dartmouth, MA (US)

(73) Assignee: Ixion, LLC, Fall River, MA (US)

( * ) Notice: Subject to any disclaimer, the term of this patent is extended or adjusted under 35 U.S.C. 154(b) by 0 days.

(21) Appl. No.: 09/504,514

(22) Filed: Feb. 15, 2000

Related U.S. Application Data

(60) Provisional application No. 60/120,068, filed on Feb. 16, 1999.

(51) Int. Cl.⁷ .............................. H01J 5/00; H01J 5/46; B32R 15/00; H05K 5/04
(52) U.S. Cl. ................ 257/666; 257/774; 257/680; 257/701; 257/758; 257/726; 257/727; 428/668; 428/935; 428/682; 439/608; 174/52; 174/50.6; 174/57; 29/879; 29/884; 361/248; 102/202.2; 102/202.5
(58) Field of Search ................... 257/666, 774, 257/680, 700, 701, 758, 726, 727, 717; 428/668, 935, 682; 439/608; 174/52, 50.6, 57; 29/879, 884; 361/248; 102/202.2

(56) References Cited

U.S. PATENT DOCUMENTS

| | | | | |
|---|---|---|---|---|
| 3,582,978 A | * | 6/1971 | Petersen et al. | 174/50.52 |
| 3,861,896 A | * | 1/1975 | Belknap | |
| 4,453,033 A | * | 6/1984 | Duff et al. | 29/879 |
| 4,528,086 A | * | 7/1985 | Kato et al. | 204/427 |
| 4,792,503 A | * | 12/1988 | Eppley | 429/181 |
| 4,932,723 A | * | 6/1990 | Mills | 299/86 |
| 4,935,714 A | * | 6/1990 | Vermilyea | 335/299 |
| 4,940,429 A | * | 7/1990 | Chambers et al. | 439/608 |
| 4,944,225 A | * | 7/1990 | Barker | 102/202.5 |
| 5,013,615 A | * | 5/1991 | Sisolak | 174/50.63 |
| 5,217,596 A | * | 6/1993 | Indig et al. | 204/435 |
| 5,297,001 A | * | 3/1994 | Sterling | 257/717 |
| 5,367,956 A | * | 11/1994 | Folge, Jr. | 102/202.2 |
| 5,385,578 A | * | 1/1995 | Bush et al. | 607/122 |
| 5,760,316 A | * | 6/1998 | Niolon, Jr. | 73/866.5 |
| 5,848,113 A | * | 12/1998 | Kim et al. | 376/256 |
| 5,942,842 A | * | 8/1999 | Fogle, Jr. | 313/313 |

FOREIGN PATENT DOCUMENTS

| | | | |
|---|---|---|---|
| JP | 7-55748 | * | 3/1995 |

\* cited by examiner

*Primary Examiner*—Alexander O. Williams
(74) *Attorney, Agent, or Firm*—Weingarten, Schurgin, Gagnebin & Lebovici LLP

(57) ABSTRACT

The invention provides a lead structure having a lead of low resistance material disposed within a surrounding sleeve or collar of low expansion material which is bonded at one end to the lead. The sleeve or collar is bonded on its outer surface to an insulating wall through which the lead structure extends. The lead is preferably copper and the sleeve or collar is preferably a nickel-alloy. The lead is hermetically sealed to the surrounding sleeve, and the sleeve is hermetically sealed to the insulating wall to provide a hermetic structure which does not detract from the use of high conductivity electrical lead materials which are often not employable in conventional hermetic sealed leads or packages. A plurality of lead structures can be employed in one or more walls of a circuit package.

11 Claims, 4 Drawing Sheets

LOW RESISTANCE HERMETIC LEAD STRUCTURE

CROSS REFERENCE TO RELATED APPLICATIONS

This application claims priority under 35 U.S.C. §119(e) to Provisional Application No. 60/120,068, filed Feb. 16, 1999; the disclosure of which is incorporated herein by reference.

STATEMENT REGARDING FEDERALLY SPONSORED RESEARCH OR DEVELOPMENT

N/A

BACKGROUND OF THE INVENTION

Integrated circuits and devices that can handle and control significant currents are increasingly being developed. The packaging of these integrated circuits and devices usually needs to be hermetically sealed. The leads used in such packages are highly conductive and the body of the package is made of a good insulator. Highly conductive materials have a thermal coefficient of expansion (TCE) that is much higher than that of insulators. As the heat being generated by such packages increases, the bonds between the leads and the insulator are stressed. Such stresses can lead to a shortened life of the package due to loss of the hermetic seal.

Technologies have been developed to bridge the gap in TCEs and maintain the hermetic seal needed for reliable operation. Among the technologies tried have been the development of less conductive leads having a TCE more nearly matching that of the insulator, insulative materials with a higher TCE for use as the insulator and development of multi-step sealing mechanisms that progressively span the TCE gap between the two materials being bonded. Unfortunately, these methods have resulted in compromised performance, expensive materials or time consuming and expensive processes in the manufacturing cycle.

BRIEF SUMMARY OF THE INVENTION

The invention provides a lead structure having a lead of low resistance material disposed within a surrounding sleeve or collar of low expansion material which is bonded at one end to the lead. The sleeve or collar is bonded on its outer surface to an insulating wall through which the lead structure extends. The lead is preferably copper and the sleeve or collar is preferably a nickel-alloy such as Kovar. The lead is hermetically sealed to the surrounding sleeve, and the sleeve is hermetically sealed to the insulating wall to provide a hermetic structure which does not detract from the use of high conductivity electrical lead materials which are often not employable in conventional hermetic sealed leads or packages. A plurality of lead structures can be employed in one or more walls of a circuit package.

The low expansion sleeve has a thermal coefficient of expansion (TCE) sufficiently similar to that of the insulator wall to which it is bonded to provide a hermetic seal that is resistant to thermal stresses. The sleeve is bonded to the insulator by brazing or other known hermetic sealing techniques. The lead is bonded to the surrounding sleeve by welding or other known techniques sufficient to withstand the thermal stresses experienced during expansion and contraction of the lead relative to the sleeve.

BRIEF DESCRIPTION OF THE SEVERAL VIEWS OF THE DRAWING

The invention will be more fully understood from the following detailed description taken in conjunction with the accompanying drawings in which.

DETAILED DESCRIPTION OF THE INVENTION

Figure 1:
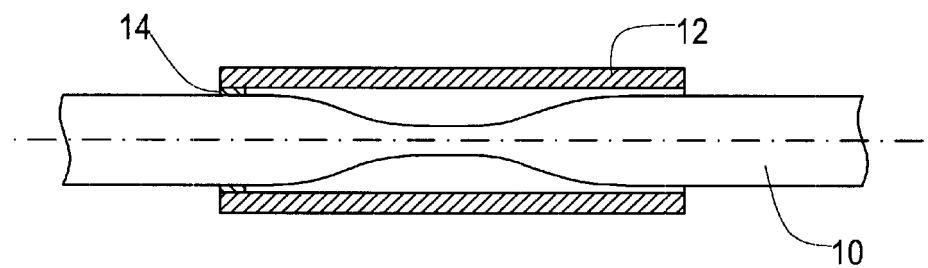
FIG. 1 is an enlarged cutaway side view of a lead structure embodying the invention.

A lead structure is shown in FIG. 1 and includes a lead 10 which typically is copper or a copper alloy disposed in a surrounding sleeve 12 which is of a low expansion material such as ASTM F15 alloy (Kovar) a nickel-iron alloy, alloy 52, alloy 48, alloy 46 and alloy 42. The lead is bonded to one end of the sleeve by a weld 14, high temperature braze or other appropriate bond. The lead is not bonded to the surrounding sleeve other than at the single end. In this illustrated embodiment, the lead is necked down to a central portion of smaller diameter to provide clearance for expansion of the lead when it is heated.

Figure 2:
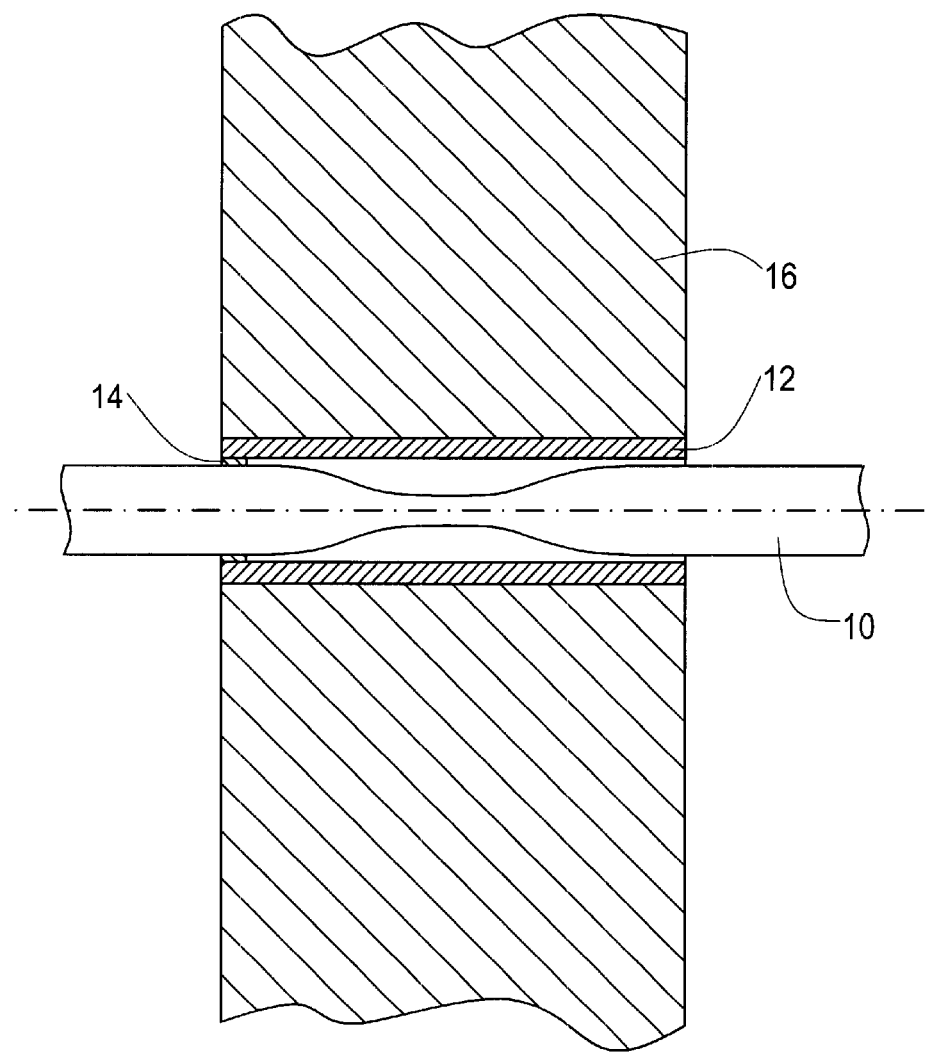
FIG. 2 is an enlarged cutaway side view of the lead structure of FIG. 1 bonded to an insulator.

As shown in FIG. 2 the lead structure is disposed within an opening of an insulator wall 16. The outer surface of the sleeve 12 is bonded to the wall such as by a braze or high temperature solder or other known sealing technique, usually along the entire mating surface. The bond used for joining the lead to one end of the sleeve and for joining the sleeve to the insulator should have a melting temperature higher than the temperature employed for package fabrication or sealing, so that the lead structure will remain intact during subsequent steps in fabricating a package or other device in which the lead structure is employed. The sleeve is typically of about the same length as the thickness of the insulator 16 through which the lead structure extends. The lead 10 is of intended length to suit particular electrical circuit package requirements.

Figure 3A:
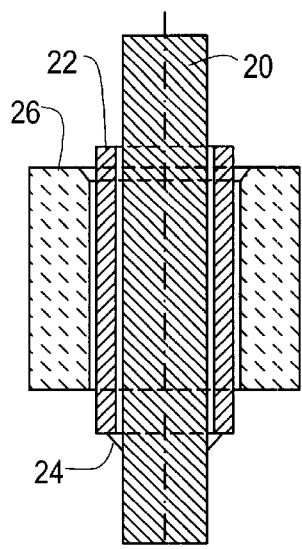
FIG. 3a is a cutaway side view of another embodiment of lead structure according to the invention.
Figure 3B:
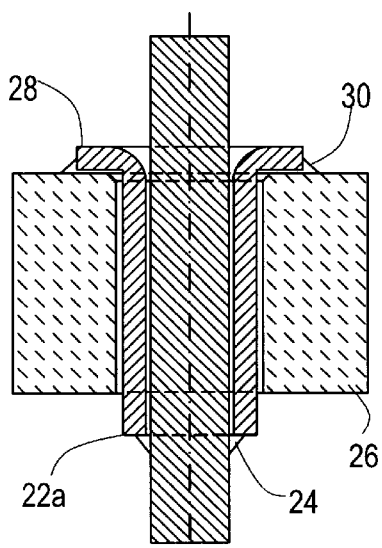
FIG. 3b is an embodiment having a sleeve with a circular flange on one end thereof.
Figure 3C:
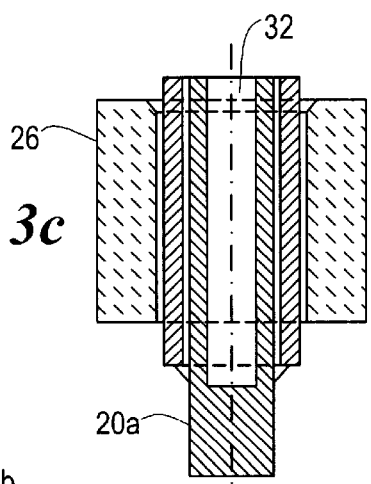
FIG. 3c is an embodiment having a lead with a blind opening therein.
Figure 3D:
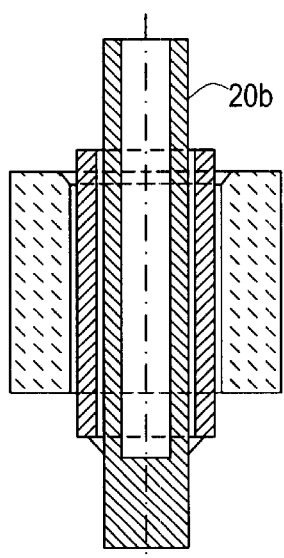
FIG. 3d is a variation of the embodiment of FIG. 3c.
Figure 3E:
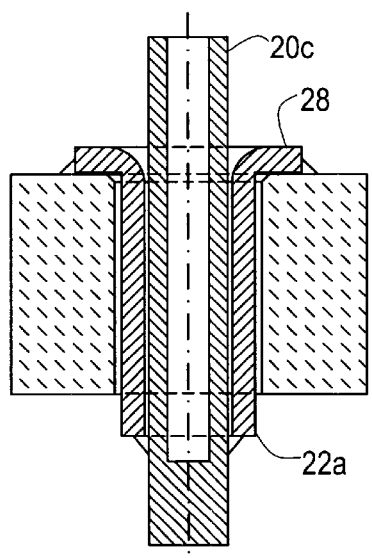
FIG. 3e is a variation of the embodiment of FIG. 3b.

The lead with a necked down region as described above is not necessary. Alternatively, the lead can be of uniform cross-section, typically circular as shown in the embodiments to be described below. The lead is of a diameter less than the inside diameter of the surrounding sleeve to provide sufficient clearance for expansion of the lead when it is heated. A clearance of about 6 mils. is usually sufficient to accommodate a temperature range up to about 900° C. Alternative embodiments of lead structures in accordance with the invention are shown in FIGS. 3a–3e. In FIG. 3a the lead 20 is of uniform diameter and is disposed within sleeve 22 and bonded at one end by weld 24. The outer surface of sleeve 22 is bonded to an insulator 26. In FIG. 3b there is shown a sleeve having a circular lip portion 28 which is bonded to a confronting annular surface of insulator 26. For some purposes it is useful to have an electrical lead with a blind opening therein such as to accept a pin or plug. Such configurations are shown in FIGS. 3c–3e. In FIG. 3c the lead 20a with a blind opening 32 has an upper end generally flush with the end of sleeve 26. In FIG. 3d the lead 20b extends outwardly from the sleeve on both ends. In FIG. 3e a lead 20c with a blind opening is shown with the sleeve 22a having a circular flange or lip portion 28 as in FIG. 3b.

Figure 4B:
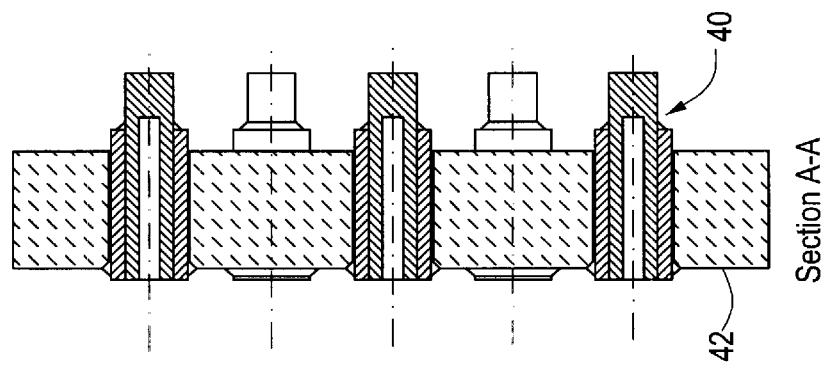
FIGS. 4a and 4b are top and cutaway side views respectively of lead structures in a circular insulator.
Figure 4A:
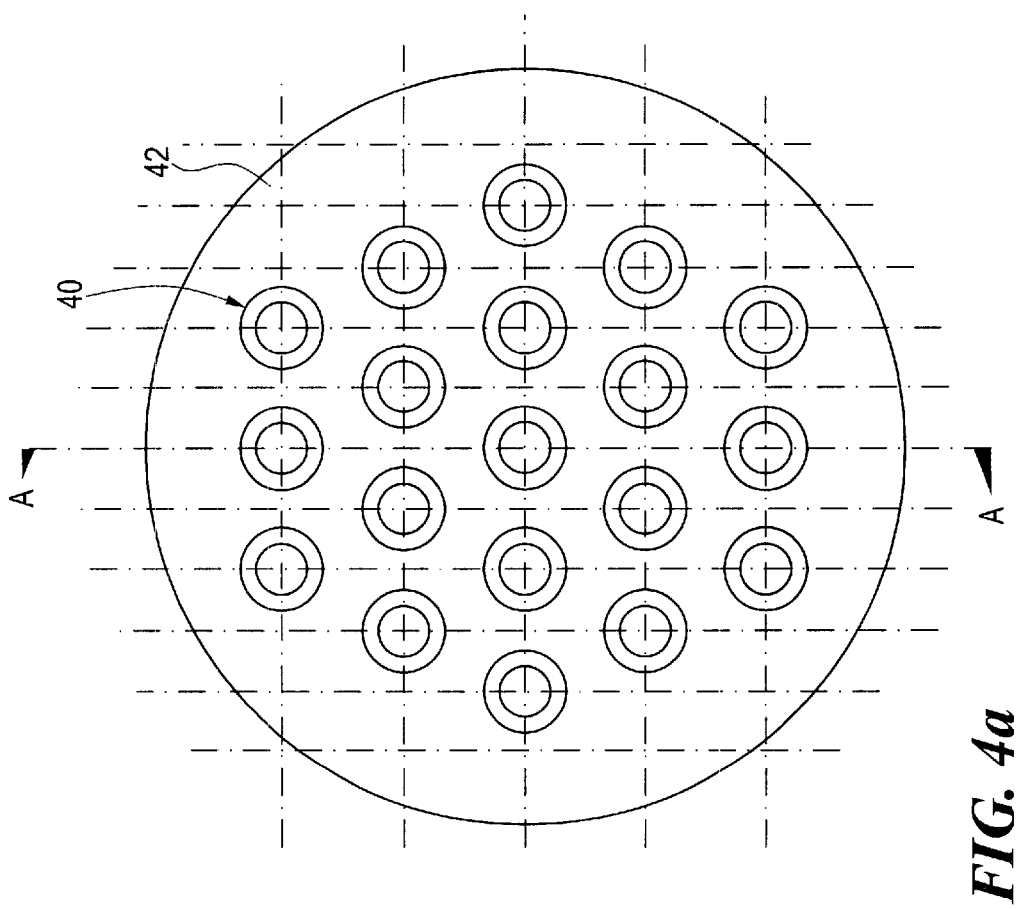
Figure 5:
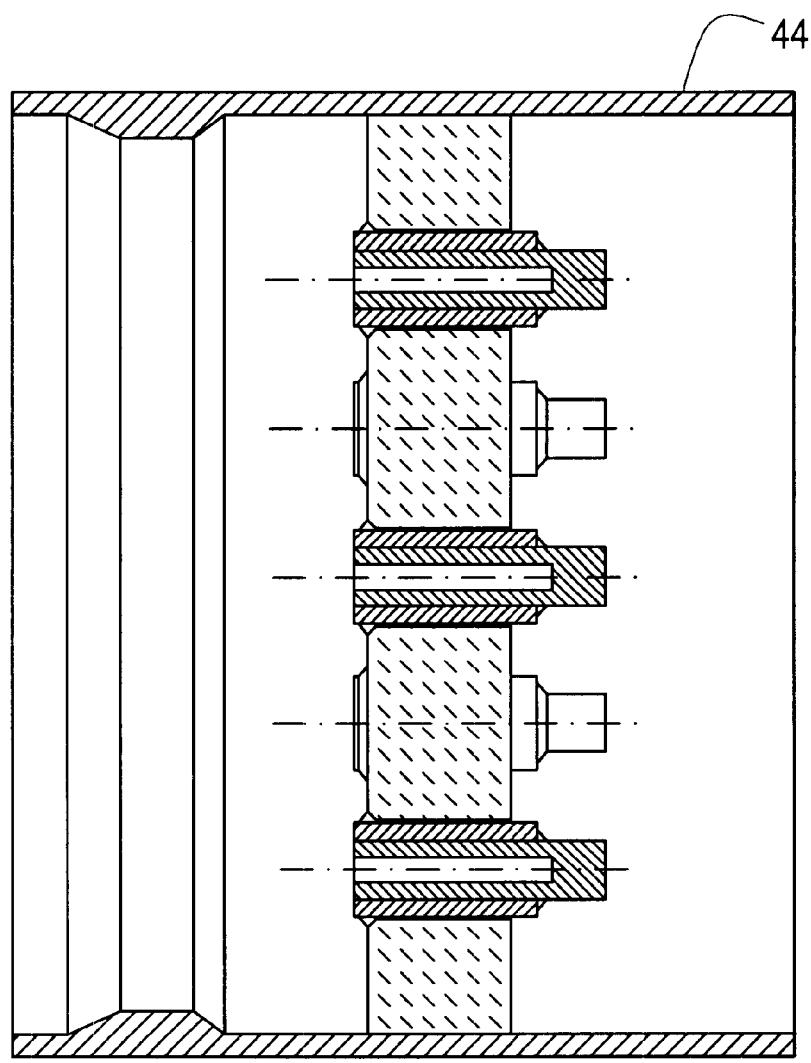
FIG. 5 is a cutaway side view of the lead structures of FIG. 4 in a surrounding shell.

An array of hermetically sealed lead structures can be provided in an insulative substrate or member of any configuration to suit a particular application. FIGS. 4a and 4b illustrate an array of lead structures 40 provided in a circular disk 42. The disk can be mounted in a conductive sleeve or shell 44 as illustrated in FIG. 5 to provide a connector structure. The shell may be non-conductive for some applications. The array of lead structures can also be provided in a wall of an electronic package to serve as feedthroughs for a device or circuit.

It will be appreciated that lead structures of the type described are illustrative of the application of the invention and are not intended to limit the invention. Any of the lead structures can be used in a variety of configurations. Having described preferred embodiments of the invention it will now become apparent to those of ordinary skill in the art that other embodiments incorporating these concepts may also be used. Accordingly, it is submitted that the invention should not be limited to the described embodiments but rather should be limited only by the spirit and scope of the appended claims.

What is claimed is:

1. A lead structure for hermetically sealing to an insulator, said lead structure comprising:

a lead of highly conductive material; and a sleeve having a first end, a middle section and a second end, said sleeve made of low expansion material and disposed around a portion of said lead, an inside of said first end of said sleeve bonded to said lead and said middle section and said second end of said sleeve separate from said lead.

2. The lead structure of claim 1 wherein said lead is cylindrical.

3. The lead structure of claim 2 wherein said lead has a blind-opening operative to receive a contact lead.

4. The lead structure of claim 2 wherein said lead is solid.

5. The lead structure of claim 1 wherein said lead is shaped for use in an integrated circuit package.

6. The lead structure of claim 1 wherein said lead is made of a copper based material.

7. The lead structure of claim 1 wherein said sleeve is of a material chosen from the set of ASTM F15 alloy, alloy 52, alloy 48, alloy 46 and alloy 42.

8. The lead structure of claim 1 wherein said lead has a necked-down portion and said first end of said sleeve is bonded to said lead such that said sleeve covers said necked-down portion.

9. The lead structure of claim 1 wherein said second end of said sleeve has a lip adapted to be bonded to a surrounding insulator.

10. A hermetically sealed interconnection assembly comprising:

a plurality of lead structures, each including a lead of highly conductive material and a sleeve having a first end, a middle section and a second end, said sleeve made of low expansion material and disposed around a portion of said lead, an inside of said first end of said sleeve bonded to said lead; and a substrate of insulating material having a plurality of holes disposed therethrough each of said lead structures disposed in a respective one of said holes, and having an outer surface of said second end of the sleeve of the lead structure bonded to the confronting portion of the insulating material disposed around the sleeve.

11. The assembly of claim 10 including a shell surrounding the substrate and attached thereto.

* * * * *